United States Patent [19]
Kamiyama et al.

[11] Patent Number: 5,776,820
[45] Date of Patent: Jul. 7, 1998

[54] METHOD OF FORMING A HIGH-FREQUENCY TRANSISTOR T GATE ELECTRODE

[75] Inventors: Tomoyuki Kamiyama; Yamato Ishikawa, both of Wako, Japan

[73] Assignee: Honda Giken Kogyo Kabushiki Kaisha, Tokyo, Japan

[21] Appl. No.: 588,636

[22] Filed: Jan. 19, 1996

[30] Foreign Application Priority Data

Jan. 30, 1995 [JP] Japan ................................ 7-048940

[51] Int. Cl.$^6$ ........................................... H01L 21/28
[52] U.S. Cl. ........................ 438/574; 438/579; 438/951
[58] Field of Search ............................. 438/571, 573, 438/574, 577, 578, 579, 182, 949, 951; 148/DIG. 100

[56] References Cited

U.S. PATENT DOCUMENTS

| 4,283,483 | 8/1981 | Coane ................................ 438/577 |
| 4,700,462 | 10/1987 | Beaubien et al. ................. 438/577 |
| 4,975,382 | 12/1990 | Takasugi ........................... 438/571 |
| 4,977,100 | 12/1990 | Shimura ............................ 438/574 |
| 5,496,779 | 3/1996 | Lee et al. ........................... 438/574 |

FOREIGN PATENT DOCUMENTS

| 6-53242 | 2/1994 | Japan .............................. 438/336 |
| 653244 | 2/1994 | Japan . |

*Primary Examiner*—Michael Trinh
*Attorney, Agent, or Firm*—Lyon & Lyon LLP

[57] ABSTRACT

A method of forming a T-type gate electrode of a high-frequency transistor having excellent high-frequency power transfer characteristic with no concave portions and protrusions. A first resist pattern having a first relatively narrow opening is formed on a semiconductor substrate and a leg portion of the electrode is formed in the first opening by depositing electrode metal on the substrate. A second resist pattern having a second relatively wide opening is formed over the electrode leg portion for locating an exposed tip of the electrode leg portion in the bottom of the second opening and forming a head portion of the electrode by depositing electrode metal in the second opening. The head portion is etched for removing any protrusions formed on the head portion.

5 Claims, 3 Drawing Sheets

METHOD OF FORMING A HIGH-FREQUENCY TRANSISTOR T GATE ELECTRODE

BACKGROUND OF THE INVENTION

The present invention relates to a method of forming a T-type gate electrode in a High-frequency transistor.

Generally, a gate electrode of a high-frequency transistor (FET) is required to have a reduced width against the transistor substrate and a decreased resistance to attain improved high-frequency power transfer characteristic and, therefore, it is formed like a T that comprises a relatively narrow leg portion and a relatively wide head portion supported by the leg portion.

FIGS. 3(a) and 3(b) show an example of conventional method of forming a T-type gate electrode in the transistor FET, whereby a first resist pattern 3 having a relatively narrow opening 2 for forming therein a leg portion of a gate electrode is prepared on a semiconductor substrate 1, a second resist pattern 5 having a relatively wide opening for forming therein a head portion 4 is prepared over the first pattern, an electrode metal (Au) is then deposited thereon to form a solid unitary electrode with its leg portion 61 in the opening 2 and its head portion 62 in the opening 4 (FIG. 3(a)), and then a layer 7 of the deposited electrode metal is lifted off by removing the first resist pattern 3 and the second resist pattern 5 to finally obtain a T-type gate electrode 6 on the semiconductor substrate 1 (FIG. 3(b)).

This conventional method, however, has such a drawback that integrally forming the leg portion 61 together with the head portion 62 by depositing electrode metal thereon results in forming a concave 8 on the top of the head portion 62 by the effect of the leg portion 61. Furthermore, in forming the electrode by lifting off the deposited metal layer, the lower portion of the electrode naturally widens toward the bottom, and, therefore, the electrode head portion 62 formed in the relatively wide opening 4 may have a widely protruding edge 9.

FIGS. 4(a)-(d) show another conventional method that is disclosed in Japanese Laying-Open Patent No. 6-53244 as follows: A semiconductor substrate is covered first with a resist pattern 3 having a relatively narrow opening 2 for forming therein a leg portion of a gate electrode, the electrode metal is then applied thereon by evaporation for forming the leg portion (FIG. 4(a)), and the resist pattern 3 is removed for lifting off the deposited metal layer 7 (FIG. 4(b)). A head portion 62 of the gate electrode is then separately formed by depositing electrode metal, using a second resist pattern 5 having a relatively wide opening 4 for locating an exposed tip of the leg portion in its bottom portion (FIG. 4(c)) and the second resist pattern 5 is removed for lifting the deposited metal layer 12 (FIG. 4(d)). A T-type gate electrode 6 is thus formed on the semiconductor substrate.

The above-mentioned method may prevent forming a concave on the top of the head 62 by virtue of separately forming the electrode head portion after forming the electrode leg portion, but it may cause, on the contrary, the electrode leg portion 61 to have a protrusion 11. This also may result in forming a widely projecting flange 9 of the head portion 62 in the relatively wide opening 4.

The problems of the conventional methods are such that the T-type gate electrode 6 may be formed with a considerable deformation, may be easily damaged at a concave 8 and allows the electric field to concentrate locally at the protrusion 9. This prevents the high-frequency power from being transferred to the semiconductor substrate 1, impairing the high-frequency power transfer characteristic of the high-frequency transistor.

SUMMARY OF THE INVENTION

Accordingly, an object of the present invention is to provide a method of forming a T-type gate electrode of a high frequency transistor with no deformations (concave top and protrusions) to assure its excellent high-frequency transfer characteristic, which comprises the steps of: forming a first resist pattern having a first relatively narrow opening on a semiconductor substrate and forming a leg portion of an electrode in the first opening by depositing electrode metal on the substrate; forming a second resist pattern having a second relatively wide opening over the electrode leg portion to allow an exposed tip of the electrode leg portion in the bottom of the second opening and forming a head portion of the electrode by depositing electrode metal in the second opening; and removing a protrusion formed in the head portion by etching.

Figure 1A:
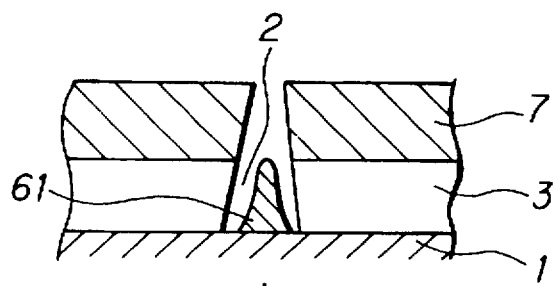
FIGS. 1(a)-1(f) illustrate a method of forming a gate electrode of a high-frequency transistor, which is an embodiment of the present invention.

Throughout the above-mentioned drawings, like components are given like reference numerals, i.e., semiconductor substrate is given numeral 1, a relatively narrow opening 2 for forming a leg portion, a first resist pattern 3, a relatively wide opening 4 for forming a head portion, a second resist pattern 5, a T-type gate electrode 6, a leg portion 61 of an electrode, a head portion 62 of an electrode, a concave 8, a protrusion 9, a resist film 10 and a protrusion 11.

DESCRIPTION OF THE PREFERRED EMBODIMENTS

FIGS. 1(a)-(f) illustrate a process for forming a gate electrode of a high-frequency transistor according to the present invention.

As shown in FIG. 1(a), a thin layer of EB (electron beam) resist is applied to a semiconductor substrate 1, irradiated by an electron beam at a specified portion and etched to form a relatively narrow opening 2 for forming therein a leg portion of a gate electrode. A first resist pattern 3 with the relatively narrow opening 2 formed therein is subjected to deposition of an electrode metal 7 (Au) thereon to form the electrode leg portion 61 of about 250 nm in height in the opening 2.

Figure 1B:
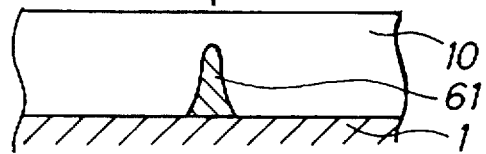
Figure 1C:
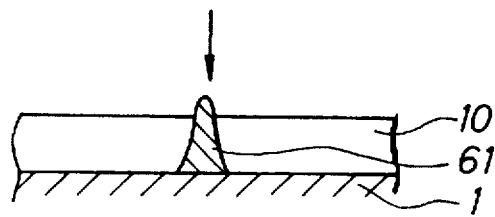

The first resist pattern 3 is removed with an organic solvent to lift off a layer of the deposited electrode metal 7. As shown in FIG. 1(b), a thin layer 10 of resist that can not be dissolved in the organic solvent contained in a resist 5 is applied onto the electrode leg portion 61 in the semiconductor substrate. The resist layer 10 is then etched to expose a tip of the electrode leg portion 61 to a specified extent as shown in FIG. 1(c).

Figure 1D:
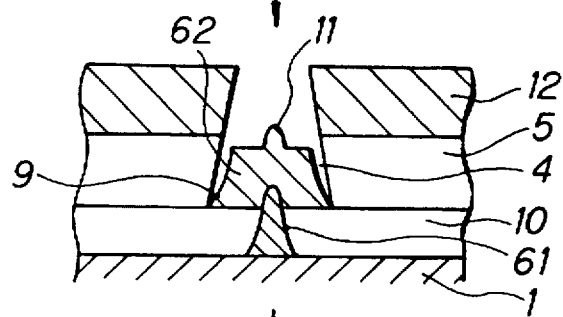

As shown in FIG. 1(d), a thin coat of EB resist is applied over the resist layer 10 on the electrode leg portion with its tip exposed therein and a specified portion of the EB resist coat is subjected to patterning by radiation of an electron beam or ultraviolet rays to form a relatively wide opening 4 for forming a head portion of the gate electrode. A thin layer of electrode metal 12 (Au) is deposited over the second resist pattern 5 wherein the relatively wide opening 4 has been formed, and then the electrode head portion 62 of about 1 micron in thickness is formed in the opening 4 thereon.

The electrode head portion 62 thus formed has a protrusion 11 formed on its top corresponding to a tip of the leg portion 61, which protrudes from the resist layer 10, and has an outwardly protruding edge 9.

Figure 1E:
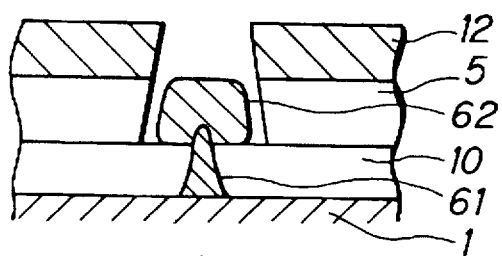

The protruding edge 9 and protruding tip 11 of the electrode head portion 62 are removed by etching to obtain a correct form shown in FIG. 1(e).

An electrode head portion 62 whose deposition thickness is about 1 micron may be practically formed by etching for about 25 seconds with a water solution containing KI, I and $H_2O$ in the ratio of 2:1:5.

Finally, the resist layer 5 and resist layer 10 are removed by dissolving in an organic solvent to lift off a layer 12 of the deposited electrode metal as shown in FIG. 1 (f). The T-type gate electrode 6 thus processed is free from deformation such as a concave top or protrusions.

Figure 2:
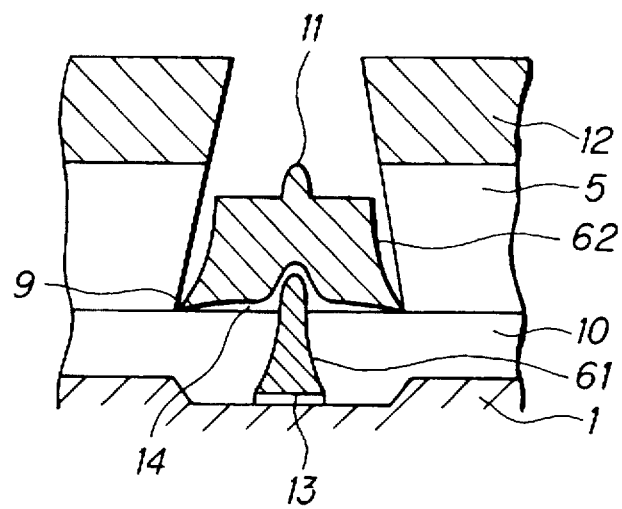
FIG. 2 illustrates a method of forming a gate electrode of a high-frequency transistor, which is another embodiment of the present invention.
Figure 3A:
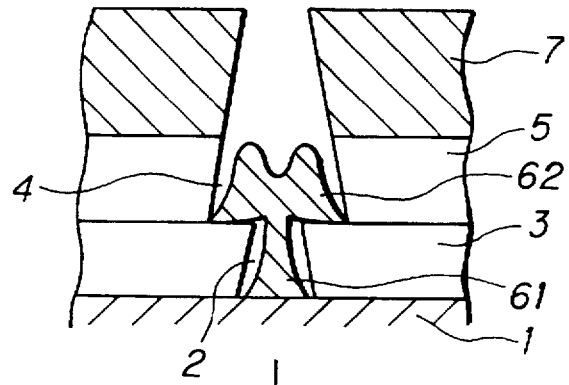
FIGS. 3(a) and 3(b) illustrate a conventional method of forming a T-type gate electrode of a high-frequency transistor.
Figure 3B:
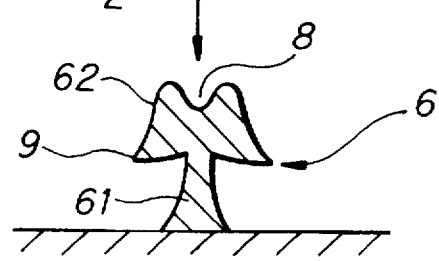
Figure 4A:
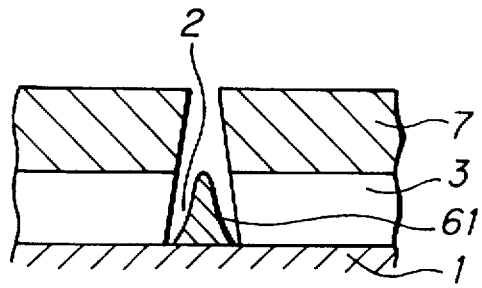
FIGS. 4(a)-4(d) illustrate another conventional method of forming a T-type gate electrode of a high-frequency transistor.
Figure 4B:
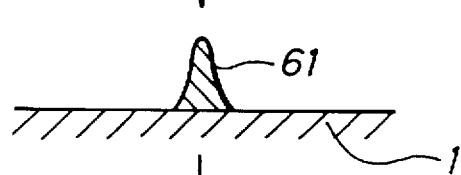
Figure 4C:
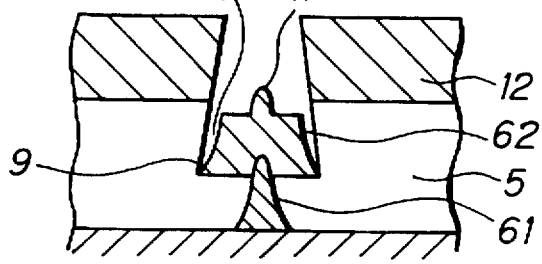
Figure 4D:
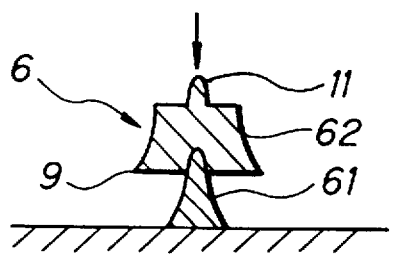

FIG. 2 illustrates another embodiment of the present invention.

Figure 1F:
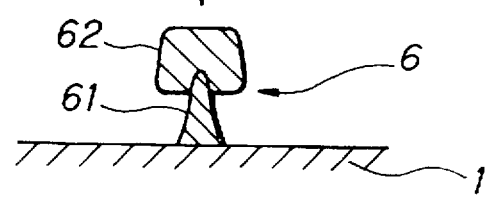

To improve the adhesion of an electrode leg portion 61 to a semiconductor substrate 1, which serves as a Schottky barrier, this method comprises the following steps of: forming a 10 nm thick layer 13 of, for example, Ti by vacuum deposition on the semiconductor substrate 1; forming the electrode leg portion 61 on the Ti-layer 13; forming a 10 nm thick layer 14 of, for example, Ti by vacuum deposition over a resist layer 10 with an exposed therein tip of the electrode leg portion 61; and forming an electrode head portion 62. The protrusions 9 and 11 may be removed by etching, as shown in FIG. 1(e), and then the layers 5, 10 and 12 removed, as shown in FIG. 1(f).

As is apparent from the foregoing, the method according to the present invention has an advantage of consistently and reliably forming a T-type gate of a high frequency transistor with no deformations (concave top and protrusions) and having an excellent high-frequency transfer characteristic.

What is claimed is:

1. A method of forming a T gate electrode of a high-frequency transistor comprising the steps of: forming a first resist pattern having a first opening on a semiconductor substrate and forming a leg portion of the electrode in the first opening by depositing electrode metal on the substrate within the first opening; removing the first resist pattern and deposited electrode metal on the first resist pattern; forming a resist layer on said substrate and said leg portion of the electrode; etching a portion of said resist layer to expose a tip of said leg portion of the electrode; forming a second resist pattern having a second opening wider than said first opening over the electrode leg portion for locating said exposed tip of the electrode leg portion in the bottom of the second opening and forming a head portion of the electrode by depositing electrode metal in the second opening; etching the head portion for removing a protrusion formed on the head portion; and removing the second resist pattern to form the T gate electrode.

2. The method of claim 1, wherein said step of etching the head portion is performed with the second resist pattern in place, said etching being performed within the second opening.

3. A method of forming a T gate electrode of a high-frequency transistor comprising the steps of: forming a first resist pattern having a first opening on a semiconductor substrate; forming an adhesion layer on the substrate within the first opening; forming a leg portion of the electrode in the first opening by depositing electrode metal on the adhesion layer in the substrate within the first opening; removing the first resist pattern and deposited electrode metal on the first resist pattern; forming a resist layer on said substrate and said leg portion of the electrode: etching a portion of said resist layer to expose a tip of said leg portion of the electrode; forming a second resist pattern having a second opening wider than said first opening over the electrode leg portion for locating said exposed tip of the electrode leg portion in the bottom of the second opening and forming a head portion of the electrode by depositing electrode metal in the second opening; etching the head portion for removing a protrusion formed on the head portion, and removing the second resist pattern to form the T gate electrode.

4. A method of forming a T gate electrode of a high-frequency transistor comprising the steps of: forming a first resist pattern having a first opening on a semiconductor substrate and forming a leg portion of the electrode in the first opening by depositing electrode metal on the substrate within the first opening; removing the first resist pattern and deposited electrode metal on the first resist pattern; forming a resist layer on said substrate and said leg portion of the electrode; etching a portion of said resist layer to expose a tip of said leg portion of the electrode; forming a second resist pattern having a second opening wider than said first opening on the electrode leg portion for locating said exposed tip of the electrode leg portion in the bottom of the second opening; forming an adhesion layer on the exposed tip of the electrode leg; forming a head portion of the electrode by depositing electrode metal on the adhesion layer and within the second opening; etching the head portion for removing a protrusion formed on the head portion; and removing the second resist pattern to form the T gate electrode.

5. The method of claim 4 including a step of forming an adhesion layer on the substrate within the first opening before forming the leg portion of the electrode.

* * * * *